United States Patent
James et al.

(10) Patent No.: US 10,649,663 B2
(45) Date of Patent: May 12, 2020

(54) MEMORY ACCESS SYSTEM (71) Applicant: National Technology & Engineering Solutions of Sandia, LLC, Albuquerque, NM (US)

(72) Inventors: Conrad D. James, Albuquerque, NM (US); Tu-Thach Quach, Albuquerque, NM (US); Sapan Agarwal, Dublin, CA (US); James Bradley Aimone, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 221 days.

(21) Appl. No.: 15/665,075

(22) Filed: Jul. 31, 2017

(65) Prior Publication Data
US 2019/0034358 A1    Jan. 31, 2019

(51) Int. Cl.
*G06F 3/06* (2006.01)
*H03M 7/30* (2006.01)
*G06F 12/14* (2006.01)
*G06F 9/52* (2006.01)

(52) U.S. Cl.
CPC ............ *G06F 3/061* (2013.01); *G06F 3/0638* (2013.01); *G06F 3/0679* (2013.01); *G06F 9/52* (2013.01); *G06F 12/1441* (2013.01); *H03M 7/3062* (2013.01); *G06F 2212/1052* (2013.01)

(58) Field of Classification Search
CPC .... H03M 7/3062; G06F 3/061; G06F 3/0638; G06F 3/0679
See application file for complete search history.

(56) References Cited

U.S. PATENT DOCUMENTS

| | | | | |
|---|---|---|---|---|
| 7,978,757 B1* | 7/2011 | Kutz | ................ | H04L 25/03012 333/18 |
| 10,013,384 B1* | 7/2018 | Wang-Roveda | ...... | G06F 1/3234 |
| 10,037,804 B1* | 7/2018 | Buchanan | .......... | G11C 13/0069 |
| 2004/0006453 A1* | 1/2004 | Gluhovsky | .......... | G06F 17/5022 703/15 |
| 2007/0253242 A1* | 11/2007 | Parkinson | .............. | G11C 7/065 365/163 |
| 2011/0101957 A1* | 5/2011 | Boufounos | .......... | H03M 7/3062 324/76.12 |
| 2012/0324140 A1* | 12/2012 | Ordentlich | ......... | G11C 13/0002 710/317 |
| 2013/0042083 A1* | 2/2013 | Mutalik | ................ | G06F 3/0604 711/162 |

(Continued)

OTHER PUBLICATIONS

The Energy Scaling Advantages of Rram Crossbars by Agarwal 2015 (Year: 2015).*

(Continued)

*Primary Examiner* — Paul M Knight
(74) *Attorney, Agent, or Firm* — Yee & Associates, P.C.

(57) ABSTRACT

A method and system for accessing a memory for a data processing system. The method comprises sending a read request for a plurality of locations in the memory to read the plurality of locations in parallel based on an upper bound for reading the memory. The upper bound for a number of locations is based on a group of constraints for the memory. The method receives a summed value of a plurality of memory values in the plurality of locations in the memory.

19 Claims, 8 Drawing Sheets

(56) References Cited

U.S. PATENT DOCUMENTS

| | | | | |
|---|---|---|---|---|
| 2014/0068174 A1* | 3/2014 | Stark | ............... | H04L 45/745 |
| | | | | 711/108 |
| 2017/0199786 A1* | 7/2017 | Muralimanohar | ....... | G11C 8/10 |
| 2017/0323677 A1* | 11/2017 | Ge | ..................... | G11C 11/24 |

OTHER PUBLICATIONS

Energy Scaling Advantages of Resistive Memory Crossbar Based Computation Agarwal Jan. 2016 (Year: 2016).*

Compressive Binary Search Castro 2012 (Year: 2012).*

Read-Out Design Rules for Molecular Crossbar Architectures Csaba 2009 (Year: 2009).*

Estimating Unknown Sparsity in Compressed Sensing Lopes 2013 (Year: 2013).*

Message Encryption Using DNA Sequences Menaka 2014 (Year: 2014).*

Writing to and reading from a nano-scale crossbar Vontobel 2009 (Year: 2009).*

Overcoming the Challenges of Crossbar Resistive Memory Architectures Xu 2015 (Year: 2015).*

Single-Readout High-Density Memristor Crossbar Zidan 2015 (Year: 2015).*

Incremental All Pairs Similarity Search for Varying Similarity Thresholds by Awekar (Year: 2009).*

Node Splitting Algorithms in Tree Structured High Dimensional Indexes for Similarity Search by Fu (Year: 2002).*

Dynamic 3-D Facial Compression Using Low Rank and Sparse Decomposition by Hou (Year: 2012).*

Interior-Point Methodology for 3-D PET by Johnson (Year: 2000).*

An Interior-Point Method for Large-Scale '1-Regularized Least Squares by Kim (Year: 2007).*

Dual-Augmented Lagrangian Method for Efficient Sparse Reconstruction by Tomioka (Year: 2009).*

High Performance Computing and Communications First International Conference; Fast Sparse Matrix-Vector Multiplication by Exploiting Variable Block Structure by Vuduc (Year: 2005).*

Compressive Sensing meets Unreliable Link: Sparsest Random Scheduling for Compressive Data Gathering in Lossy WSNs by Wu (Year: 2014).*

Agarwal et al., "Energy Scaling Advantages of Resistive Memory Crossbar Based Computation and Its Application to Sparse Coding", Frontiers in Neuroscience, Jan. 6, 2016, 9 pages.

Berinde et al., "Combining Geometry and Combinatorics: A Unified Approach to Sparse Signal Recovery", 2008 46th Annual Conference on Communication, Control and Computing, Sep. 23-26, 2008, 21 pages.

Brauldi, "Matrices of Zeros and Ones with Fixed Row and Column Sum Vectors", Linear Algebra and its Applications, vol. 33, Oct. 1980, pp. 159-231.

Braun et al., "Info-Greedy Sequential Adaptive Compressed Sensing", IEEE Journal of Selected Topics in Signal Processing, vol. 9, No. 4, Jun. 2015, 14 pages.

Carrier et al., "A hardware-based memory acquisition procedure for digital investigations", Digital Investigation, vol. 1, No. 1, Feb. 2004, pp. 50-60.

Chan et al., "A Framework for Volatile Memory Forensics", 16th ACM Conference on Computer and Communications Security, Nov. 2009, 3 pages.

Davenport et al., "Compressive Binary Search", 2012 IEEE International Symposium on Information Theory Proceedings (ISIT), Jul. 2012, 5 pages.

Genov et al., "Charge-Mode Parallel Architecture for Vector-Matrix Multiplication", IEEE Transactions on Circuits and Systems II: Analog and Digital Signal Processing, vol. 48, No. 10, Oct. 2001, pp. 930-936.

Gilbert et al., "Sparse Recovery Using Sparse Matrices", Proceedings of the IEEE, vol. 98, No. 6, Jun. 2010, pp. 937-947.

Law et al. "Consistency Issue on Live System Forensics", Future Generation Communication and Networking (FGCN 2007), Dec. 2007, 5 pages.

Lopes, "Estimating Unknown Sparsity in Compressed Sensing", Proceedings of the 30th International Conference on Machine Learning (ICML '13), Jun. 2013, pp. 217-225.

Schatz, "BodySnatcher: Towards Reliable Volatile Memory Acquisition by Software", Proceedings of the Digital Forensic Research Conference 2007, Aug. 2007, pp. S126-S134.

Sinha et al. "High-Performance and Low-Voltage Sense-Amplifier Techniques for sub-90nm SRAM", IEEE International Systems-on-Chip (SOC) Conference, Sep. 2003, pp. 113-116.

Vomel et al. "A survey of main memory acquisition and analysis techniques for the windows operating system", Digital Investigation, vol. 8, Jun. 2011, pp. 3-22.

* cited by examiner

801 — Input: vector $x = (x_0, \ldots, x_{n-1})$, $x_i \in \{0, 1\}$
Output: $\hat{x}$ 803 — $\hat{x} \leftarrow$ zero vector of length n 804 — $Q \leftarrow$ empty queue 805 — Q.enqueue(0, n)

806 — while Q is not empty do

807 — a,b $\leftarrow$ Q.dequeue()

808 — $t = \sum_{i=a}^{b-1} x_i$ ▷ sample x

809 — if t > 0 then

810 — if b - a = 1 then ▷ Leaf node

811 — $\hat{x}_a \leftarrow t$

812 — else

813 — i $\leftarrow$ (b - a)/2

814 — Q.enqueue(a, a + i) ▷ Left node

815 — Q.enqueue(a + i, b) ▷ Right node

FIG. 8

```
900
901 ── Input: m, n, d
       Output: A
903 ── A ← zero m-by-n matrix
904 ── o ← zero m-by-1 vector          ▷ # of ones in each row
905 ── j ← 1
       while j ≤ n do
907 ──   o' ← o
908 ──   Q ← empty priority queue
909 ──   w ← random m-by-1 vector
910 ──   for i ← 1 to m do
911 ──     Q.enqueue(i, $o_j$, $w_i$)
           for l ← 1 to d do
913 ──       i ← Q.dequeue()
914 ──       $A_{ij}$ ← 1
915 ──       $o_i$ ← $o_i$ + 1
916 ──   if $A_{\cdot j}$ is unique then
917 ──     j ← j + 1
           else
             $A_{\cdot j}$ ← 0
             o ← o'
```

MEMORY ACCESS SYSTEM

GOVERNMENT LICENSE RIGHTS

This invention was made with United States Government support under Contract No. DE-NA0003525 between National Technology & Engineering Solutions of Sandia, LLC and the United States Department of Energy. The United States Government has certain rights in this invention.

BACKGROUND INFORMATION

1. Field

The present disclosure relates generally to memories for data processing systems, and in particular, to a method and system for accessing a memory.

2. Background

In a digital investigation, the storage devices in a computer may be examined to search for evidence of malware or illegal activities. Storage devices, such as volatile memory, may be examined during this process.

Volatile memory acquisition has long been an active area of research in the information forensics and security community. As memory capacity increases, many applications, such as Web browser sessions and instant messages, can store information entirely in memory. Further, memory resident malware, that lives only in volatile memory, can be difficult to detect without analyzing the volatile memory content.

Thus, acquiring data stored in volatile memory for examination is often performed. Volatile memory cannot be analyzed offline without the risk of losing data stored in the memory. The data in the memory may be copied to a non-volatile storage for offline processing.

This acquisition process has challenges in maintaining the integrity of the acquired data. Ideally, all modifications to the memory are halted until the data from the memory can be read from the memory to ensure that the integrity of the collected data can be guaranteed. However, the operating system may overwrite the memory content during the process of reading data from the memory, resulting in data consistency issues.

Therefore, it would be desirable to have a method and apparatus that take into account at least some of the issues discussed above, as well as other possible issues. For example, it would be desirable to have a method and apparatus that overcome a technical problem with accessing memories.

SUMMARY

An embodiment of the present disclosure provides a method for accessing a memory for a data processing system. The method comprises sending a read request for a plurality of locations in the memory to read the plurality of locations in parallel based on an upper bound for reading the memory. The upper bound for a number of locations is based on a group of constraints for the memory. The method receives a summed value of a plurality of memory values in the plurality of locations in the memory.

Another embodiment of the present disclosure provides a memory system. The memory system comprises a memory and a controller. The controller sends a read request for a plurality of locations in the memory to read the plurality of locations in parallel based on an upper bound for reading the memory. The upper bound for a number of locations is based on a group of constraints for the memory and receives a summed value of a plurality of memory values in the plurality of locations in the memory.

Yet another embodiment of the present disclosure provides a memory system. The memory system comprises a memory device and a controller. The controller sends a read request for a plurality of locations in a memory to read the plurality of locations in parallel for reading the memory.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. The illustrative embodiments recognize and take into account that data consistency issues may be reduced through decreasing the time needed to read data. The illustrative embodiments recognize and take account that currently, data is read serially from memories. As the size of the memory increases, the time needed to acquire the data increases.

The illustrative embodiments also recognize and take into account that some memories support a summation function. The summation function allows for a parallel input of addresses for locations in a memory. The resulting output is a summed value for the values in those locations.

The illustrative embodiments recognize and take into account that this function may be used to more quickly access memory. The illustrative embodiments provide a method, apparatus, and computer program product for accessing a memory. In one illustrative example, a read request for a plurality of locations in the memory is sent to read the plurality of locations in parallel based on an upper bound for reading the memory. The upper bound for a number of locations is based on a group of constraints for the memory. A summed value of a plurality of memory values in the plurality of locations in the memory is received. This type of sampling of locations in a memory may be used to reconstruct the memory. In other words, the values of locations in the memory may be reconstructed using summed values obtained using a summation function in the memory.

Figure 1:
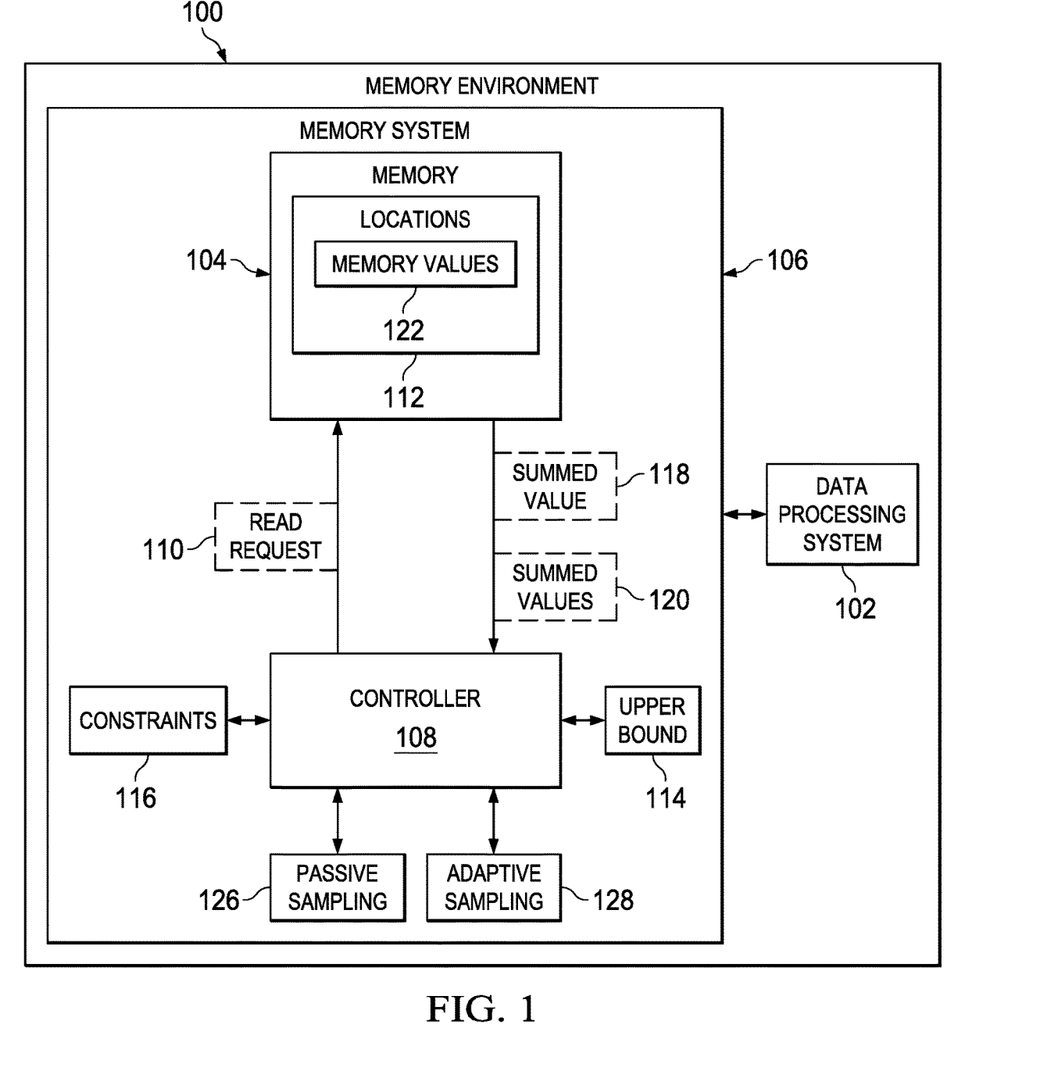
FIG. 1 is an illustration of a block diagram of a memory environment in accordance with an illustrative embodiment.

With reference now to the figures, and in particular with reference to FIG. 1, an illustration of a block diagram of a memory environment is depicted in accordance with an illustrative embodiment. Memory environment 100 includes data processing system 102. Data processing system 102 may take various forms. For example, data processing system 102 may be a desktop computer, a server, a mobile phone, a tablet computer, a kiosk, a set-top box, or some other suitable type of data processing system.

In this illustrative example, memory 104 is a part of memory system 106 for data processing system 102. In this illustrative example, memory 104 may be accessed by controller 108. For example, controller 108 may sample memory 104.

Memory 104 may take a number of different forms. For example, memory 104 may be selected from one of a cross point memory, a cross bar memory, a dynamic random access memory (DRAM), an optical memory, a quantum memory, or some other suitable type of memory.

Controller 108 may read different parts of memory 104 in sampling memory 104. In this illustrative example, controller 108 performs parallel sampling of memory 104.

As depicted, controller 108 sends read request 110 for a plurality of locations 112 in memory 104 to read the plurality of locations 112 in parallel. The number of locations selected for the plurality of locations 112 read in parallel may be based on upper bound 114 for reading memory 104.

In this illustrative example, upper bound 114 for the number of locations 112 is based on a group of constraints 116 for memory 104. As used herein, a "group of" when used with reference to items, means one or more items. For example, a group of constraints 116 is one or more of constraints 116. In this illustrative example, constraints 116 may be selected from at least one of an amount of power used, a voltage, a current, a physical limit on parallel reads for the memory device, or some other factor relating to memory 104.

Controller 108 receives summed value 118 of a plurality of memory values 122 in the plurality of locations 112 in memory 104. Summed value 118 may be used to reconstruct memory 104. Controller 108 may repeatedly send read request 110 and receive summed values 120. Summed values 120 are used to determine memory values 122 for locations 112 in memory 104.

Controller 108 may implement a number of different techniques in sampling memory 104 to reconstruct values in locations 112 in memory 104. In this illustrative example, controller 108 may use at least one of passive sampling 126 or adaptive sampling 128.

As used herein, the phrase "at least one of", when used with a list of items, means different combinations of one or more of the listed items may be used, and only one of each item in the list may be needed. In other words, "at least one of" means any combination of items or number of items may be used from the list, but not all of the items in the list are required. The item may be a particular object, a thing, or a category.

For example, without limitation, "at least one of item A, item B, or item C" may include item A, item A and item B, or item B. This example also may include item A, item B, and item C; or item B and item C. Of course, any combinations of these items may be present. In some illustrative examples, "at least one of" may be, for example, without limitation, two of item A, one of item B, and ten of item C; four of item B and seven of item C; or other suitable combinations.

In the illustrative example, controller 108 may be implemented in software, hardware, firmware or a combination thereof. When software is used, the operations performed by controller 108 may be implemented in program code configured to run on hardware, such as a processor unit. When firmware is used, the operations performed by controller 108 may be implemented in program code and data, and stored in persistent memory to run on a processor unit. When hardware is employed, the hardware may include circuits that operate to perform the operations in controller 108.

In the illustrative examples, the hardware may take a form selected from at least one of a circuit system, an integrated circuit, an application specific integrated circuit (ASIC), a programmable logic device, or some other suitable type of hardware configured to perform a number of operations. With a programmable logic device, the device may be configured to perform the number of operations. The device may be reconfigured at a later time or may be permanently configured to perform the number of operations. Programmable logic devices include, for example, a programmable logic array, a programmable array logic, a field programmable logic array, a field programmable gate array, and other suitable hardware devices. Additionally, the processes may be implemented in organic components integrated with inorganic components and may be comprised entirely of organic components, excluding a human being. For example, the processes may be implemented as circuits in organic semiconductors.

In one illustrative example, one or more technical solutions are present that overcome a technical problem with accessing a memory as quickly as desired. One or more technical solutions read locations in a memory in parallel. Additionally, one or more technical solutions also include an upper bound to the number of locations that can be read in parallel based on constraints with respect to a memory. As a result, one or more technical solutions may provide a technical effect of reducing the amount of time needed to access memories. One or more technical solutions also provide a technical effect of reconstructing a memory more quickly as compared to current techniques.

As a result, data processing system 102 operates as a special purpose data processing system in which controller 108 for data processing system 102 enables an ability to access memory 104 more quickly as compared to current techniques. In particular, controller 108 transforms data processing system 102 into a special purpose data processing system, as compared to currently available general computer systems that do not have controller 108.

The illustration of memory environment 100 in FIG. 1 is not meant to imply physical or architectural limitations to the manner in which an illustrative embodiment may be implemented. Other components, in addition to or in place of the ones illustrated, may be used. Some components may be unnecessary. Also, the blocks are presented to illustrate some functional components. One or more of these blocks may be combined, divided, or combined and divided into different blocks when implemented in an illustrative embodiment.

For example, memory system 106 may be located in data processing system 102, connected to data processing system 102, or in communication with data processing system 102. In another illustrative example, controller 108 may access one or more memories in addition to or in place of memory 104. In yet another illustrative example, controller 108 may be located in data processing system 102.

Figure 2:
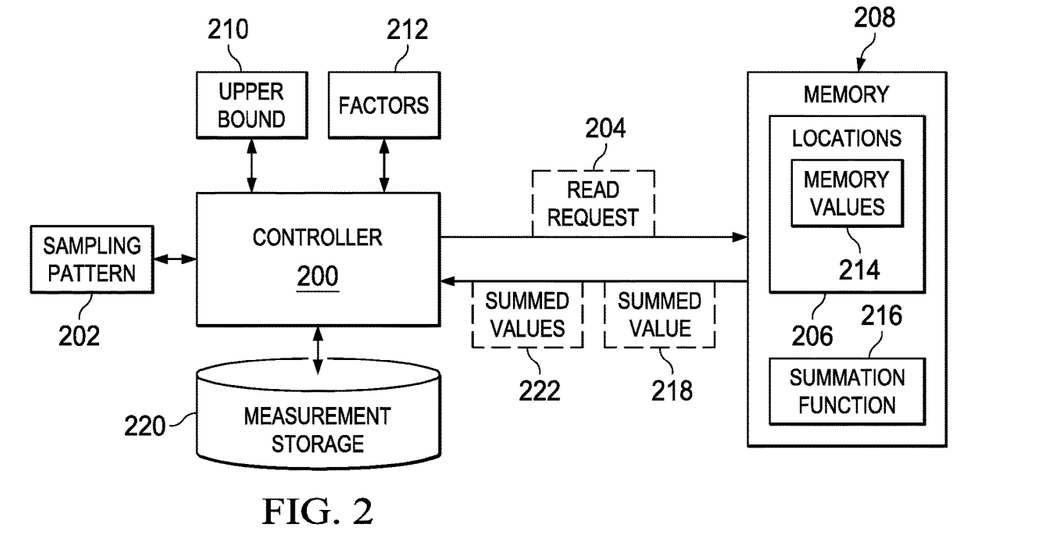
FIG. 2 is an illustration of a dataflow for passive sampling in accordance with an illustrative embodiment.

With reference now to FIG. 2, an illustration of a dataflow for passive sampling is depicted in accordance with an illustrative embodiment. As depicted, controller 200 identifies sampling pattern 202 for locations 206 in memory 208. In this example, controller 200 and memory 208 may be located in a data processing system, such as data processing system 102 in FIG. 1, or may be located in a storage device, such as a hard disk drive, a solid-state disk drive, a flash drive, a thumb drive, or some other suitable type of storage device in which memory 208 may be present.

Sampling pattern 202 is used to identify a plurality of locations 206 for read request 204 to memory 208. The number of locations 206 specified for read request 204 may be constrained by upper bound 210. In this example, sampling pattern 202 is created taking into account factors 212 for reconstructing memory values 214 and upper bound 210 for the number of locations 206.

In this illustrative example, read request 204 is to read the plurality of locations 206 in memory 208. The plurality of locations 206 is a part of locations 206 and is a sample. Read request 204 results in a parallel reading of the plurality of locations 206, in contrast to reading the plurality of locations 206 in a serial fashion.

Memory 208 includes summation function 216. As depicted, summation function 216 returns summed value 218 to controller 200. Summed value 218 is a sum of memory values 214 in the plurality of locations 206.

Controller 200 stores summed value 218 in measurement storage 220. Measurement storage 220 is a storage device in which summed values 222 obtained from memory 208 are stored. Measurement storage 220 may be, for example, a flash drive, a hard disk drive, a memory, a nonvolatile memory, a volatile memory, or some other suitable type of storage device.

Controller 200 repeatedly sends requests to memory 208 until all of sampling pattern 202 has been used to obtain summed values 222. Thereafter, controller 200 reconstructs memory values 214 in memory 208 using summed values 222. This reconstruction may include solving a linear program. The linear program may be solved using existing techniques, including a simplex method and interior point technique.

In selecting upper bound 210, the energy cost associated with sampling memory 208 is considered. For example, controller 200 may be employed to fully sample memory 208 using parallel reads which take the same or less energy than serially reading memory 208 while operating faster.

Figure 3:
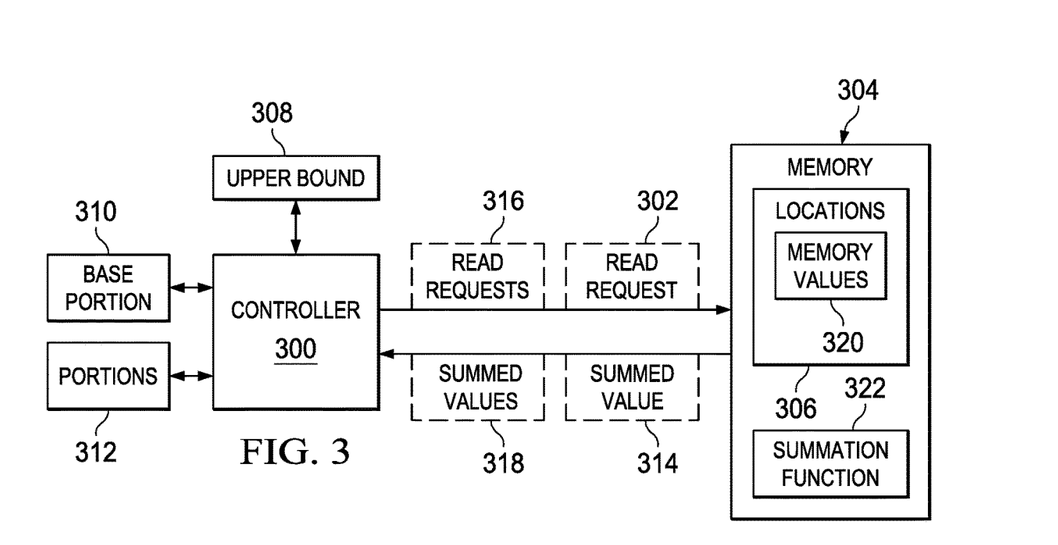
FIG. 3 is an illustration of a dataflow for a data sample in accordance with an illustrative embodiment.

With reference next to FIG. 3, an illustration of a dataflow for a data sample is depicted in accordance with an illustrative embodiment. As depicted, controller 300 and memory 304 may be located in a data processing system, such as data processing system 102 in FIG. 1, or may be located in a storage device, such as a hard disk drive, a solid-state disk drive, a flash drive, a thumb drive, or some other suitable type of storage device in which memory 304 may be present.

In this illustrative example, controller 300 generates and sends read request 302 to memory 304. Read request 302 is a request to read a plurality of locations 306 within memory 304. Read request 302 is to read the plurality of locations 306 in parallel. The plurality of locations 306 may be all of locations 306. In some examples, the plurality of locations 306 may be limited in number by upper bound 308 to a portion of locations 306. This plurality of locations 306 is base portion 310 of locations 306 for memory 304.

Memory 304 also includes summation function 322. Summed value 314 is returned for the plurality of locations 306 as summed using summation function 322. If summed value 314 is zero, those locations are no longer used to read memory 304, because each of the plurality of locations 306 in base portion 310 has a memory value of zero.

If summed value 314 is non-zero and more than one location is present in base portion 310, controller 300 divides base portion 310 into a plurality of portions 312. The plurality of portions 312 may equal or unequal the number of locations 306. The plurality of portions 312 may be two or more portions, depending on the particular implementation.

Each of the plurality of portions 312 is set or designated as base portion 310. Read requests 316 are sent for each of these base portions in the plurality of portions 312. Summed values 318 are received from memory 304.

Controller 300 sends read requests 316 to memory 304 to read locations 306 for the plurality of portions 312. Controller 300 receives summed values 318 for the plurality of portions 312. Each of the plurality of portions 312 having a summed value of zero is no longer considered in the process. Each of the plurality of portions 312 having a non-zero value and having more than one location are again divided into additional portions and designated as base portions for processing. This process occurs until all of locations 306 have been eliminated.

Each of portions 312 having one location and a non-zero value identify memory values 320 for locations 306 in memory 304 that are non-zero. The locations in portions 312 with a zero value are empty locations in locations 306. In this manner, controller 300 adaptively reconstructs memory 304

Figure 4:
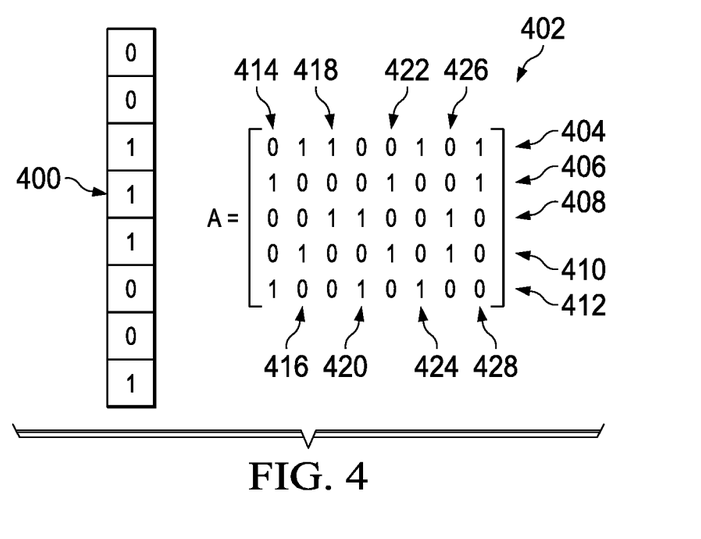
FIG. 4 is illustration of a sampling pattern in a memory in accordance with an illustrative embodiment.

With reference now to FIG. 4, an illustration of a sampling pattern in a memory is depicted in accordance with an illustrative embodiment. In this illustrative example, memory 400 is in an 8-bit memory and is an example of an implementation for memory 208 in FIG. 2. In this illustrative example, sampling matrix 402 is an example of a sampling pattern that may be used to sample memory 400 and is an example of one implementation for sampling pattern 202 in FIG. 2.

In this illustrative example, sampling matrix 402 has row 404, row 406, row 408, row 410, and row 412. In this illustrative example, sampling matrix 402 has column 414, column 416, column 418, column 420, column 422, column 424, column 426, and column 428. Each column corresponds to an address in memory 400. In this example, column 414 corresponds to address 0, column 416 corresponds to address 1, column 418 corresponds to address 2, column 420 corresponds to address 3, column 422 corresponds to address 4, column 424 corresponds to address 5, column 426 corresponds to address 6, and column 428 corresponds to address 7 in memory 400.

Each row contains zeros and ones. A logic indicates that the address corresponding to that column should be activated. For example, row 404 indicates that address 1, address 2, address 5, and address 7 should be read from memory 400.

In this example, five reads were made using sampling matrix 402. These reads are made in parallel such that a summed value is returned for each read of memory 400. In one illustrative example, the following values are returned as follow from reading memory 400: row 404=2, row 406=2, row 408=2, row 410=1, and row 412=1. With the summed values, the contents of memory 400 may be reconstructed using the following equation:

$$\min\|\alpha\|_1 \text{subject to } A\alpha = y \quad (1)$$

Where "A" is sampling matrix 402, "α" is a potential content in the memory (the search is over all possible memory content), and "y" is the summed values.

Figure 5:
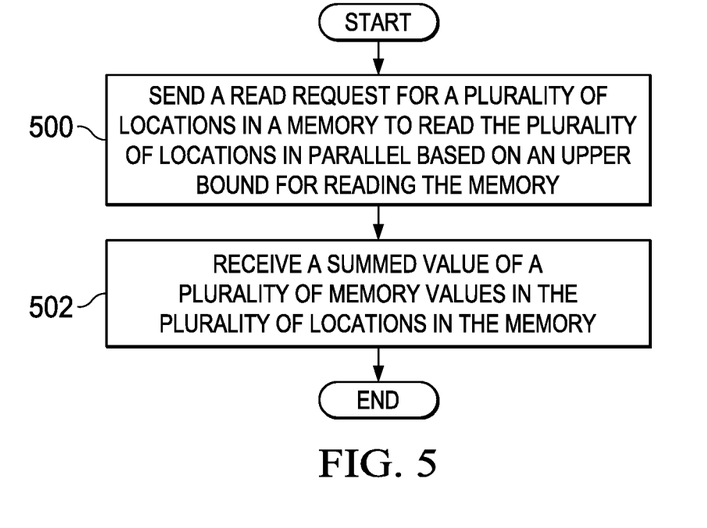
FIG. 5 is an illustration of a flowchart of a process for accessing a memory for a data processing system in accordance with an illustrative embodiment.

Turning next to FIG. 5, an illustration of a flowchart of a process for accessing a memory for a data processing system is depicted in accordance with an illustrative embodiment. The process illustrated in FIG. 5 may be implemented in program code, hardware, or some combination thereof. The process may be performed by a controller or other device to access a memory.

The process begins by sending a read request for a plurality of locations in a memory to read the plurality of locations in parallel based on an upper bound for reading the memory (step 500). The upper bound for a number of locations is based on a group of constraints for the memory.

The process receives a summed value of a plurality of memory values in the plurality of locations in the memory (step 502). The process terminates thereafter.

The steps in this flowchart may be implemented as part of a passive sampling process or an adaptive sampling process to reconstruct the contents of a memory. These different steps provide an ability to more quickly access the memory through the use of parallel reads to locations in the memory and receiving a summed value that is a result of summing the values in the locations read from the memory.

Figure 6:
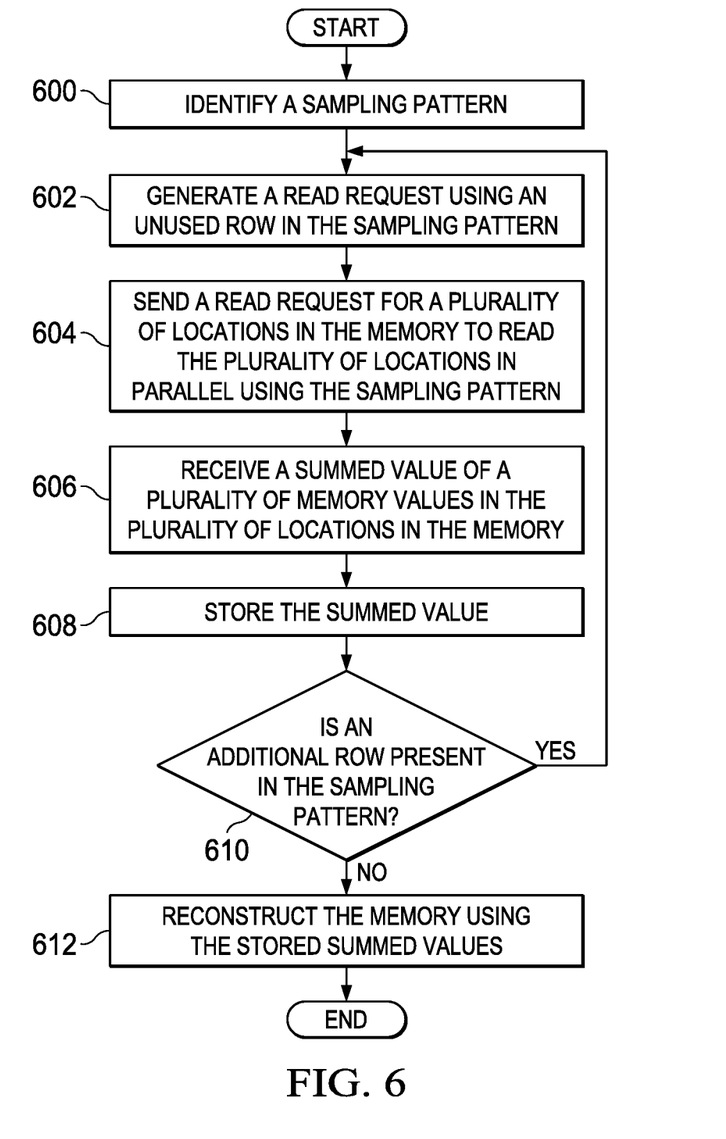
FIG. 6 is an illustration of a flowchart of a process for passive sampling in accordance with an illustrative embodiment.

With reference now to FIG. 6, an illustration of a flowchart of a process for passive sampling is depicted in accordance with an illustrative embodiment. This process may be implemented in program code, hardware, or some combination thereof.

The process begins by identifying a sampling pattern (step 600). In this illustrative example, the sampling pattern is a matrix having rows and columns, in which each row identifies memory locations for a read request. The number of columns is based on the size of the memory.

The process generates a read request using an unused row in the sampling pattern (step 602). The process sends a read request for a plurality of locations in the memory to read the plurality of locations in parallel using the sampling pattern (step 604). In this example, the read request is based on a row in a matrix for the sampling pattern.

The process receives a summed value of a plurality memory values in the plurality of locations in the memory (step 606). The process stores the summed value (step 608). Next, a determination is made as to whether an additional row is present in the sampling pattern (step 610). If an additional row is present, the process returns to step 602.

If an additional row is not present, the process reconstructs the memory using the stored summed values (step 612). The process terminates thereafter.

Figure 7:
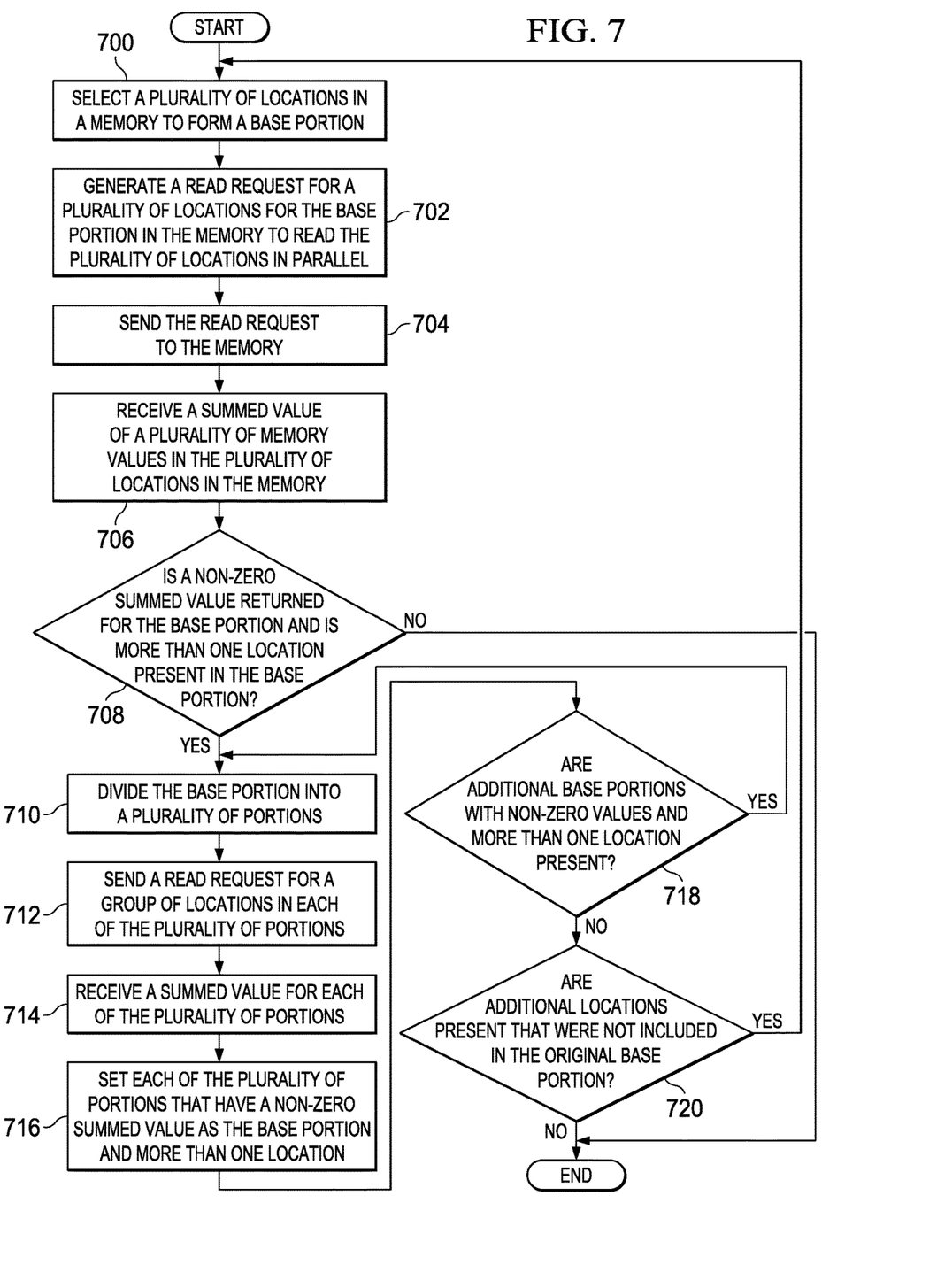
FIG. 7 is an illustration of a flowchart of a process for adaptive sampling in accordance with an illustrative embodiment.

With reference now to FIG. 7, an illustration of a flowchart of a process for adaptive sampling is depicted in accordance with an illustrative embodiment. This process may be implemented in program code, hardware, or some combination thereof.

The process begins by selecting a plurality of locations in a memory to form a base portion (step 700). The base portion may be some or all of the locations in the memory. The size of the base portion is based on an upper bound indicating a maximum number of locations that may be read in parallel from the memory.

The process generates a read request for a plurality of locations for the base portion in the memory to read the plurality of locations in parallel (step 702). The process sends the read request to the memory (step 704).

The process receives a summed value of a plurality of memory values in the plurality of locations in the memory (step 706). The process determines whether a non-zero summed value is returned for the base portion and whether more than one location is present in the base portion (step 708). If a non-zero value is not returned, the process terminates.

If a non-zero summed value is returned and more than one location is present, the process divides the base portion into a plurality of portions (step 710). The plurality of portions is two or more portions. These portions may have the same or different numbers of locations.

The process sends a read request for a group of locations in each of the plurality of portions (step 712). The process receives a summed value for each of the plurality of portions (step 714). The process sets each of the plurality of portions that have a non-zero summed value as the base portion and more than one location (step 716). A determination is made as to whether additional base portions with non-zero values and more than one location is present (step 718). If additional base portions are present, the process returns to step 710. In this manner, the steps are repeated until all of the locations in the base portions are eliminated by a base portion having a zero-summed value or a base portion that has a non-zero summed value and only a single location.

If additional base portions are not present in step 718, a determination is then made as to whether additional locations are present that were not included in the original base portion (step 720). If additional locations are present, the process returns to step 700.

Otherwise, the process terminates. When the process terminates, the memory has been reconstructed from locations with non-zero values. In this example, locations with zero values have been identified through the different steps. Additionally, the values present for each location that has a non-zero value are identified using this process.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code, hardware, or a combination of program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware. Each block in the flowcharts or the block diagrams may be implemented using special purpose hardware systems that perform the different operations or combinations of special purpose hardware and program code run by the special purpose hardware.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

Figure 8:
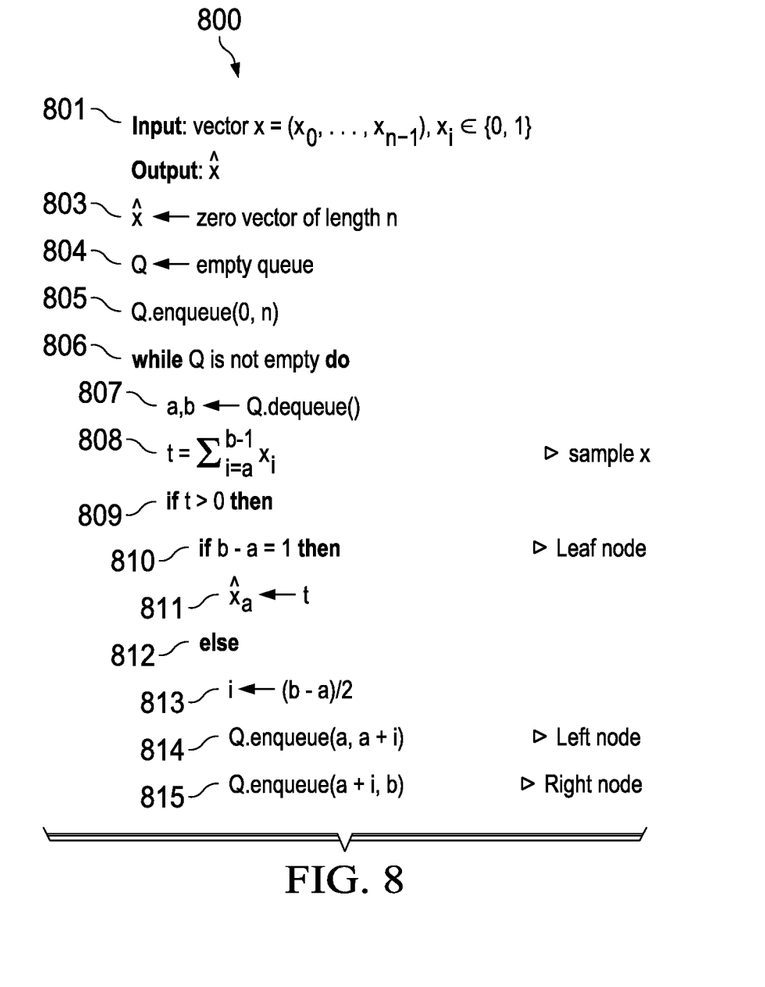
FIG. 8 is an illustration of pseudo code for adaptive sampling in accordance with an illustrative embodiment.

With reference to FIG. 8, an illustration of pseudo code for adaptive sampling is depicted in accordance with an illustrative embodiment. In this example, code 800 is pseudo code that may be implemented as program code in controller 108 in FIG. 1, controller 200 in FIG. 2, or controller 300 in FIG. 3.

In this example, the input vector is "n" length and only contains either 1's or 0's in line 801. Code 800 creates an "n" length 0 vector in line 803 and an empty queue in line 804.

As depicted, code 800 adds an element consisting of the values 0 and "n" corresponding to the range to sample the base portion in line 805. While the queue is not empty, code 800 starts sampling in line 806. This sampling is performed by code 800 taking the first element of the queue and setting "a" and "b" equal to the two values in line 807. Code 800 then takes the sum (t) of all elements in the original vector "x" between "a" and "b" in line 808. If the sum "t">0 in line 809, then there are further nodes in a tree structure below the level being examined. If b−a=1 in line 810, the current element being examined is a leaf node or end of the tree. It is added to the output vector "x" at element "a" in line 811. If b−a>1, there are additional nodes on the tree structure below this one that need to be considered in line 812. The two potential "sides" of the tree structure are re-added to the queue to be examined in line 813, line 814, and line 815. In this example, the elements are locations in the memory.

The sum of a portion of the elements, such as half of the elements, may be computed for the elements. If this quantity is non-zero, the search is continued on these elements in the same fashion. If the result is zero, the other half of the elements in memory 304 in FIG. 3 is searched.

It is straightforward to extend the bisection algorithm to accommodate for the general case where "x" contains "k" positive elements. The extension is straightforward: continue the bisection search until only one element is present to examine. In this manner, adaptive sampling does not need a post-reconstruction step. The search may be terminated prior to reaching the leaf nodes since a binary domain is present. Consider the quantity:

$$t = \Sigma_{i=a}^{b-1} x_i \quad (2)$$

If t=b−a, then each element $x_i$=1, $\forall i \in [a, b)$. In this case, no need is present to continue the search until the leaf nodes are reached because the elements in the corresponding range are known.

It can be shown that the number of times "x" is sampled in code 800 is O(k log n). In this example, "n" and "k" are assumed to be powers of 2. Except for the root node, a node is added to the queue, and subsequently sampled, if the sampled value of its parent node is non-zero.

For each non-leaf node, its sampled value is non-zero if it has a leaf node that is non-zero. Since "x" is k-sparse, the number of non-zero nodes at each level of the tree is proportional to "k". Combined with the fact that the height of the tree is O(log n), an upper bound on the number of times "x" is sampled is O(k log n) (the multiplicative constant is 2 to be exact). This bound, however, is not tight because not all levels have at least "k" nodes. Level 0 has just the root node and level 1 has only 2 nodes. In order for a level to have at least "k" nodes, that level must be at least log "k". The total number of nodes in the first log "k" levels is O(k). Therefore, at most O(k) times in the first log "k" levels is sampled, not O(k log k). Subtracting the overestimated term, O(k log k), from the bound of O(k log n), provides the result. Note that adding the O(k) term does not change the asymptotic bound.

Although both passive and adaptive sampling techniques have O(k log n/k) time, the constant term for passive sampling is smaller than adaptive sampling. As a result, passive sampling generally requires fewer measurements than adaptive sampling.

Other than the fact that adaptive sampling does not need a post-reconstruction step, adaptive sampling also has another benefit in which sampling matrices to store and recall are not needed. Similar to passive sampling, the sparsity of the data can also be estimated directly from the measurements. While the estimated sparsity is not used to recall a sampling matrix as with passive sampling, the estimated sparsity may be used to determine whether to switch to sequential sampling when data is not sparse enough to apply adaptive sampling. Again, this capability may be useful when some regions of memory might not be sparse, while others contain mostly zeros.

The issue with saturating the analog to digital (A/D) converter is not problematic in adaptive sampling. If the A/D converter is saturated, the search continues to the next pattern, as it would anyway. Note that if the data is known to be sparse, a 1-bit A/D converter may be used to determine which node to sample because the condition t>0 is essentially a binary test. Unlike passive sampling where each measurement activates at most ⌈nd/m⌉ elements, the number of activations varies in adaptive sampling, depending on which level of the tree that is being sampled. A bound on the total number of activations is provided to acquire "x":

Theorem 2. The total number of activations to acquire "x" is O(n log k+n−k). Without loss of generality, assume that both "k" and "n" are powers of 2. To determine a rough bound, observe that to sample a node at level 1, $n/2^1$ elements may be activated. Activate means that a line is turned on in the memory. Since at most O(k) nodes are sampled at each level, the total number of activations is therefore:

$$O(k \Sigma_{l=0}^{\log n} 2^l) = O(nk) \quad (3)$$

Again, this bound is not tight because not all levels have at least "k" nodes. Nodes through level log "k" may be sampled. Since sampling all nodes at each level correspond to sampling all "n" elements, the number of activations through level log "k" is O(n log k). For the remaining levels, at most O(k) nodes are sampled at each level. As a result, the total number of activations in the remaining levels is:

$$O\left(k \sum_{i=0}^{\log(\frac{n}{k})-1} 2^i\right) = O(n-k) \quad (4)$$

So the total number of activations is O(n log k+n−k).

Figure 9:
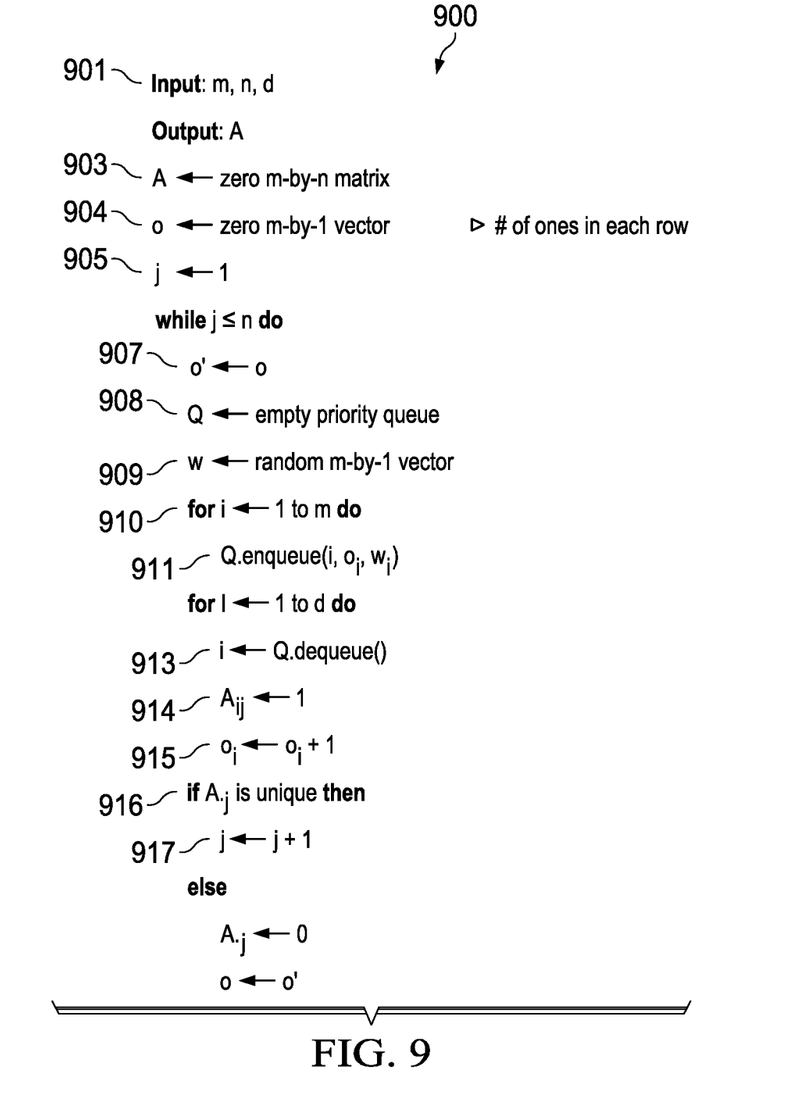
FIG. 9 is an illustration of pseudo code for creating a matrix for a sampling pattern in accordance with an illustrative embodiment.

With reference to FIG. 9, an illustration of pseudo code for creating a matrix for a sampling pattern is depicted in accordance with an illustrative embodiment. Code 900 is pseudo code that may be implemented as program code in controller 108 in FIG. 1, controller 200 in FIG. 2, controller 300 in FIG. 3, or in some other data processing system.

A matrix for a sampling pattern is created using code 900 in a manner to facilitate reconstruction of a memory. Input variables in line 901 determine how many times each of the loops in code 900 will run and the size of the matrix being output.

Code 900 starts by making an empty matrix dimensions "m-by-n" in line 903 and "o" will be a vector that stores the ones used by each row of the matrix in line 904. In this example, "j" in line 905 is the initial value representing the first column and will iterate.

As depicted, code 900 sets the current working "o'" value to the previous one in line 907, creates an empty priority queue in lines 908, and make a vector of random elements the size of the row in line 909.

Code 900 loops in line 910 to fill the queue with the rows sorted by "w" and "o" with values indexed by "i" in line 911. In this example, "w" is a random weight. Code 900 removes an element from the queue in line 913, sets the element Aij to 1 in line 914, and increases the value in the vector "o" at index "i" by 1 in line 915.

Code 900 checks to see if the column is unique in line 916. If the column is unique, "j" is incremented and the next column is selected for processing in line 917. If the column is not unique, code 900 restarts the loop on the same "j" value. Code 900 ends once each column in the matrix has been processed.

In compressed sensing, the well-known requirement is that the sampling matrix satisfies the Restricted Isometry Property (RIP-q) with q=2, which states that for any k-sparse vector "x", there exists a constant $\delta \in (0, 1)$ such that $(1-\delta)\|x\|_q \le \|Ax\|_q \le (1+\delta)\|x\|_q$. A similar requirement for sparse binary sampling matrices is that they satisfy the RIP-1 (where q=1) condition. As long as "A" satisfies the RIP-1 condition, any k-sparse vector can be reconstructed from the compressed measurements.

One manner in which a matrix may be created is to randomly select "d" rows in each column and set those to 1, while ensuring that the pattern of each column is unique. It is not necessary, however, that every column must have exactly "d" ones. As depicted, the normalized matrix, A/d satisfies the RIP-1 property.

If the matrix is constructed in the random fashion as described, it is straightforward to see that the number of ones per row follows a binomial distribution Bin(n, p=d/m). A "1" in a row indicates an activation of an element. Although the expected number of ones per row is nd/m, each row can still deviate from this mean.

As mentioned earlier, due to design constraints, such as leakage current or the number of levels supported by the A/D converter, it is desirable to control the number of activations per measurement. A different mechanism may be used to construct the sampling matrix so that the number of ones in each row is upper bounded by a desired quantity. Specifically, the number of ones in each row is upper bounded by $\lceil nd/m \rceil$. For an appropriate choice of "m", "n", and "d", the existence of such matrices is guaranteed.

In one illustrative example, the number of ones in each row is tracked as each column of the matrix A is generated. A priority queue stores the rows so that rows are sorted by the number of ones in ascending order. For each column, "d" rows are selected from the queue, which correspond to the "d" rows with the fewest number of ones. These rows are set to one for that column.

The number of ones in each of these rows is incremented accordingly so that the queue is updated. In order to encourage more random patterns and to avoid duplicate column patterns, each row may also be assigned a random weight, "w" in code 900.

When two rows have the same number of ones, their weights are used to decide their sort order in the queue. These weights are changed for each column. By generating the sampling matrix in this fashion, each column has exactly "d" ones and the number of ones in each row is upper bounded by $\lceil nd/m \rceil$. In other words, "d" and "m" may be chosen to control the number of activations per measurement. Code 900 includes the notation, A.j, which refers to column "j" of matrix A. A situation may exist where column j cannot be unique. In other words, column "j" may be a duplicate of a previous column. This condition may be detected by tracking how many attempts were made to generate column "j". When the number of attempts exceeds a threshold, the process may be restarted, or more efficiently, backtrack a few columns. The number of columns to backtrack is at most (j−1) mod (1 cm(d, m)/d), where 1 cm is the least common multiple operation.

The sampling matrix does not need to be generated during acquisition time. For example, the sampling matrix may be constructed and saved offline, then recalled during sampling of values in the memory. Furthermore, since the matrix is sparse, the entire matrix does not have to be saved. The non-zero indices for matrix may be saved. These indices are used to activate the corresponding memory elements during acquisition.

In this illustrative example, energy consumption is dependent on the underlying technology used in the memory, such as memory 104 in FIG. 1, memory 208 in FIG. 2, and memory 304 in FIG. 3. In one illustrative example, the memory is an "n-by-n" resistive crossbar: Consumption may be made so that the memory can read out "c" columns in parallel and that each column in the memory has at most "k" ones.

Passive sampling is applied to each column of the memory. For a voltage-based readout, the energy to read the array is given by the energy to charge the capacitances of the activated lines: $CV^2$, where "C" is the line capacitance and "V" is the input voltage. "V" is ignored because this variable is a constant term. The capacitance, "C", is proportional to the length of the line, "n". For a sequential read, the energy cost to read "c" columns in a row is O(cn+n), as the entire row needs to be charged. The total energy cost to read all "n" rows and "n" columns is then $O(n^3+n^3/c)$. Reading out the array using passive sampling requires activating $r=\lceil nd/m \rceil$ rows for each measurement. The energy cost associated with each measurement to read "c" columns is O(cn+rn). The total energy cost of "m" measurements and "n" columns is $O(n^3d/c+n^2k \log n/k)$.

The total energy cost using sparse sampling acquisition is asymptotically the same as that of the sequential approach. Furthermore, as long as d<c, sparse sampling incurs a lower energy cost than a sequential read. In this example, "d" is small, 4 or 8 bits is sufficient, compared to "c". As depicted, "c" can be 32 or 64 bits for a typical word size. As a result, reading multiple columns in parallel may be more energy efficient under passive sampling.

For a current-based readout, the column is kept at zero volts and so the column capacitances are not charged. In this case, the energy of the current sense amp, $E_s$, which can be on the order of "n", is the relevant column energy.

Thus, for a sequential read, the energy to read a single row and "c" columns is $O(n+cE_s)$. The total energy cost to read all "n" rows and "n" columns is $O(n^3/c+n^2E_s)$. For sparse sampling, the energy cost associated with each measurement consisting of r=⌈nd/m⌉ rows and "c" columns is $O(rn+cE_s)$. The total energy cost of "m" measurements and "n" columns is $0(n^3d/c+E_s nk \log n/k)$. The total energy cost for both methods, sequential and sparse sampling, are asymptotically identical. As with voltage-based read out, if $E_s$ is O(n) or larger and d<c, reading multiple columns in parallel can allow the column energy to dominate, making sparse sampling more energy efficient.

The energy cost of the entire system may also take into account the energy cost of the A/D converter. For example, in order to read in parallel, the memory array may have an A/D converter. To ensure the system is as efficient as desired, the number of bits in the A/D converter may be limited. This bit limitation may limit the maximum value of the sum. Further, the A/D converter will saturate if the sum exceeds that maximum. Thus, the number of bits in the A/D converter may be factors used to determine upper bound.

For a simple 4-bit A/D converter, the array energy dominates. A 4-bit A/D converter may be sufficient when the data is sparse. When the data is sparse, the output of each measurement may still be in the range supported by the A/D converter, even if the number of activations is large. In the event that a measurement saturates the A/D converter, some options may be taken.

The first option re-samples the saturated measurement as two separate measurements and repeats. This option uses a feedback mechanism during acquisition, in addition to using additional measurements.

A second option keeps the saturated measurements instead of solving for a linear program with inequalities during reconstruction. The linear program also involves inequalities. In other words, for any measurement that saturates the A/D converter, the corresponding equality constraint becomes a greater than or equal to the constraint.

Next, a third option discards any measurement that saturates the A/D converter during reconstruction. The probability of saturation is low when the data is sparse. The output measurement follows a hypergeometric distribution. The probability of getting an output measurement that reaches or exceeds the maximum number of levels supported by the A/D converter may be computed.

For a 4-bit A/D converter (16 levels), with n=1000 and k=50, if the number of activations is 150, the probability of saturating the A/D converter is 4.23e-3. This result implies that a passive sampling mechanism may be selected to acquire data stored in large capacity memories with crossbars in sub-linear time without incurring undesired additional energy costs.

Another factor that may be considered in selecting the upper bound is sparsity in the memory. In order to recall a "m-by-n" sampling matrix for acquisition, "m" needs to be identified. In this example, "m" is a function of "k", the data sparsity that can be estimated. As depicted, "k" can be computed by iterating through "x", and counting the number of non-zero locations. Performing these steps, however, may reduce the time benefit gained through sparse sampling more than desired. As mentioned earlier, sparsity estimation, in general, is non-trivial and only a lower bound is estimated. In these examples, data is binary. As a result, the sampling process itself may be used to estimate "k". For example, let y=Ax be the measurements. The sparsity estimate, $\hat{k}$, is as follows:

$$\hat{k} = \frac{1}{d} \sum_i y_i \quad (5)$$

wherein "d" is the number of ones per column of the sampling matrix, A, "i" is an index for a measurement (which corresponds to row "i" of the sampling matrix), and "$Y_i$" is the value of a measurement. This equation may provide an accurate sparsity estimate, provided that all measurements do not saturate the A/D converter. When saturation is absent, every measurement is kept and the estimate is exact and unbiased in the sense that every location is sampled exactly "d" times.

In the case of saturation, $y_i=\Sigma_j A_{ij}$ for each saturated measurement "i" and then equation (5) is used. This substitution can lead to biased estimates. The sparsity is estimated for an upper bound of the actual sparsity.

A corresponding sampling matrix for each sparsity, "k" is not needed in the illustrative example. Instead, the same sampling matrix for some increments of "k". For example, the same sampling matrix may be used for a sparsity of up to 1% of "n". Similarly, another sampling matrix may be used for a sparsity between 1% and 2%. In this manner, the sampling matrix, "A0", that corresponds to the smallest supported sparsity, "k0", is used to sample and estimate the sparsity of the data. If $\hat{k}$ is in the range supported by "A0", such as $\hat{k} \leq k0$, no further action is needed.

Otherwise, the appropriate sampling matrix, "A", may be recalled using $\hat{k}$. Note that "A0" may be reused as part of "A". In other words, if the size of "A0" is m'-by-n, the first "m'" rows of "A" correspond to "A0". The remaining "m-m'" rows of "A" are the new measurement patterns. In this manner, additional measurements overhead for sparsity estimation are not used. In the event where $\hat{k}$ is too large and that sparse sampling is not desirable, e.g., requires too many samples for perfect reconstruction, the sequential mode may be used to acquire data. Data is generally sparse, containing roughly 25% ones with vast areas containing all zeros. By selectively applying passive sampling over the entire memory, the overall acquisition time is reduced.

The passive sampling may significantly reduce the acquisition time from linear to sub-linear. Passive sampling, however, involved a post-reconstruction step. While the post-reconstruction step does not interfere with the acquisition process, avoiding a reconstruction step may be desirable. This issue may be addressed with adaptive sampling in which the next sample read is designed based on previous samples.

Figure 10:
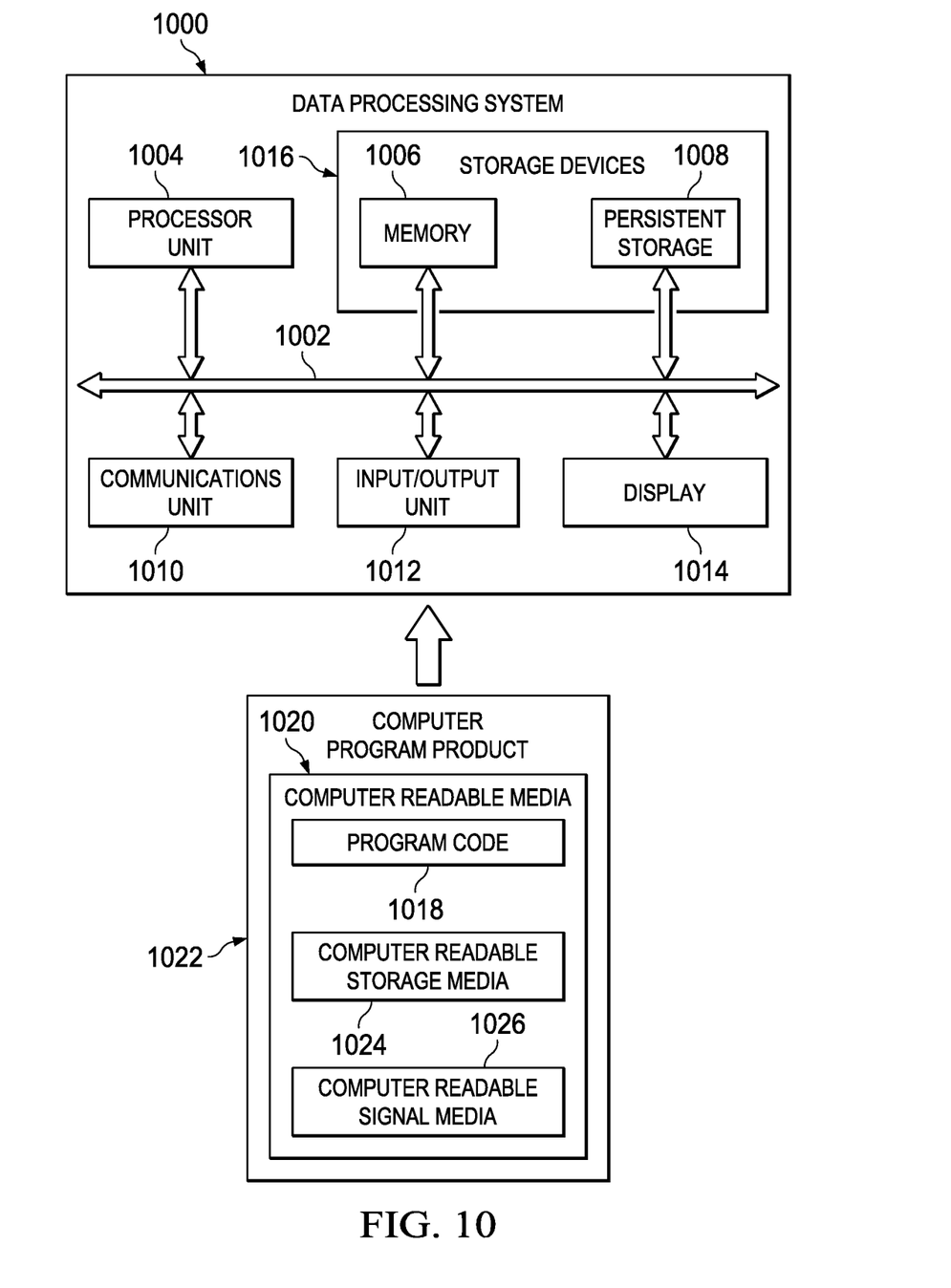
FIG. 10 is an illustration of a block diagram of a data processing system in accordance with an illustrative embodiment.

Turning now to FIG. 10, an illustration of a block diagram of a data processing system is depicted in accordance with an illustrative embodiment. Data processing system 1000 may be used to implement data processing system 102 in FIG. 1. In this illustrative example, data processing system 1000 includes communications framework 1002, which provides communications between processor unit 1004, memory 1006, persistent storage 1008, communications unit 1010, input/output unit 1012, and display 1014. In this example, communications framework 1002 may take the form of a bus system.

Processor unit 1004 serves to execute instructions for software that may be loaded into memory 1006. Processor unit 1004 may be a number of processors, a multi-processor core, or some other type of processor, depending on the particular implementation.

Memory 1006 and persistent storage 1008 are examples of storage devices 1016. A storage device is any piece of hardware that is capable of storing information, such as, for example, without limitation, at least one of data, program code in functional form, or other suitable information either on a temporary basis, a permanent basis, or both on a temporary basis and a permanent basis. Storage devices 1016 may also be referred to as computer readable storage devices in these illustrative examples. Memory 1006, in these examples, may be, for example, a random-access memory or any other suitable volatile or non-volatile storage device. Persistent storage 1008 may take various forms, depending on the particular implementation.

For example, persistent storage 1008 may contain one or more components or devices. For example, persistent storage 1008 may be a hard drive, a solid state hard drive, a flash memory, a rewritable optical disk, a rewritable magnetic tape, or some combination of the above. The media used by persistent storage 1008 also may be removable. For example, a removable hard drive may be used for persistent storage 1008.

Communications unit 1010, in these illustrative examples, provides for communications with other data processing systems or devices. In these illustrative examples, communications unit 1010 is a network interface card.

Input/output unit 1012 allows for input and output of data with other devices that may be connected to data processing system 1000. For example, input/output unit 1012 may provide a connection for user input through at least one of a keyboard, a mouse, or some other suitable input device. Further, input/output unit 1012 may send output to a printer. Display 1014 provides a mechanism to display information to a user.

Instructions for at least one of the operating system, applications, or programs may be located in storage devices 1016, which are in communication with processor unit 1004 through communications framework 1002. The processes of the different embodiments may be performed by processor unit 1004 using computer-implemented instructions, which may be located in a memory, such as memory 1006.

These instructions are referred to as program code, computer usable program code, or computer readable program code that may be read and executed by a processor in processor unit 1004. The program code in the different embodiments may be embodied on different physical or computer readable storage media, such as memory 1006 or persistent storage 1008.

Program code 1018 is located in a functional form on computer readable media 1020 that is selectively removable and may be loaded onto or transferred to data processing system 1000 for execution by processor unit 1004. Program code 1018 and computer readable media 1020 form computer program product 1022 in these illustrative examples. In one example, computer readable media 1020 may be computer readable storage media 1024 or computer readable signal media 1026.

In these illustrative examples, computer readable storage media 1024 is a physical or tangible storage device used to store program code 1018 rather than a medium that propagates or transmits program code 1018.

Alternatively, program code 1018 may be transferred to data processing system 1000 using computer readable signal media 1026. Computer readable signal media 1026 may be, for example, a propagated data signal containing program code 1018. For example, computer readable signal media 1026 may be at least one of an electromagnetic signal, an optical signal, or any other suitable type of signal. These signals may be transmitted over at least one of communications links, such as wireless communications links, optical fiber cable, coaxial cable, a wire, or any other suitable type of communications link.

The different components illustrated for data processing system 1000 are not meant to provide architectural limitations to the manner in which different embodiments may be implemented. The different illustrative embodiments may be implemented in a data processing system including components in addition to or in place of those illustrated for data processing system 1000. Other components shown in FIG. 10 can be varied from the illustrative examples shown. The different embodiments may be implemented using any hardware device or system capable of running program code 1018.

As depicted in the different illustrative examples, one or more technical solutions are present that overcome a technical problem with accessing a memory as quickly as desired. One or more technical solutions read locations in the memory in parallel and receive a summed value that is a sum of the values in the different locations read in the memory. Additionally, one or more technical solutions also include an upper bound to the number of locations that can be read in parallel based on constraints with respect to the memory. As a result, one or more technical solutions may provide a technical effect of reducing the amount of time needed to access memories. One or more technical solutions also provide a technical effect of reconstructing a memory more quickly as compared to current techniques.

In one or more illustrative examples, a controller uses parallel reads with passive sampling or adaptive sampling to acquire binary data stored in large capacity memory devices more quickly than current techniques that read data in a serial fashion. Both passive sampling and adaptive sampling reduce the number of measurements used as compared to reading data in a serial fashion from a memory. These techniques implemented in a controller may improve the acquisition time is improved by at least an order of magnitude on sparse data as compared to current techniques that read data in a serial fashion. This improvement in acquisition time may be especially useful in volatile memory forensics where data consistency is an important consideration.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component may be configured to perform the action or operation described. For example, the component may have a configuration or design for a structure that provides the component an ability to perform the action or operation that is described in the illustrative examples as being performed by the component.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for accessing a memory for a data processing system, the method comprising:

designating, by a controller, a plurality of locations in the memory as a base portion of locations;

sending, by a controller, a read request to read the plurality of locations in parallel within an upper bound that indicates a maximum number of locations that may be read in parallel from the memory according to a group of constraints for the memory;

receiving from the memory, by the controller, a summed value of respective binary values in the plurality of locations in the memory according to a summation function in the memory;

if the summed value received from the memory is zero, cease using those locations to read the memory;

if the summed value received from the memory is non-zero and more than one location is present, dividing, by the controller, the base portion into a plurality of smaller portions of locations;

designating, by the controller, each smaller portion of locations as new respective base portions;

sending, by the controller, read requests for the locations in each new base portion; and iteratively repeating, by the controller, the steps of dividing base portions with non-zero summed values and more than one location into smaller respective base portions and sending read requests for locations in the new base portions, until there are no unread base portions in the memory with non-zero sums and more than one location.

2. The method of claim 1 further comprising:
identifying a sampling pattern for sampling the locations in the memory, wherein the sampling pattern is used to identify the plurality of locations for the read request.

3. The method of claim 2 further comprising:
repeating the steps of identifying the sampling pattern for sampling the locations in the memory, sending the read request for the plurality of locations in a memory device to read the plurality of locations in parallel based on the upper bound, and receiving the summed value of the plurality of memory values in the plurality of locations in the memory using the sampling pattern to obtain summed values.

4. The method of claim 3 further comprising:
reconstructing memory values in the memory using the summed values via a simplex or interior-point method of linear programming.

5. The method of claim 3 further comprising:
creating the sampling pattern taking into account factors for reconstructing memory values and the upper bound.

6. The method of claim 1 further comprising:
reconstructing the memory is constructed from the locations with non-zero summed values.

7. The method of claim 1, wherein a constraint is based on at least one of an amount of power, a voltage, a current, or a physical limit on parallel reads for a memory device.

8. The method of claim 1, wherein the memory is selected from one of a cross point memory, a cross bar memory, a dynamic random access memory, an optical memory, and a quantum memory.

9. A memory system comprising:
a memory comprising a summation function that allows for parallel input of addresses for locations in the memory; and
a controller configured to:
designate a plurality of locations in the memory as a base portion of locations;
send a read request to read the plurality of locations in parallel within an upper bound that indicates a maximum number of locations that may be read in parallel from the memory according to a group of constraints for the memory;
receive a summed value of respective binary memory values in the plurality of locations in the memory according to the summation function;
if the summed value received from the memory is zero, cease using those locations to read the memory;
if the summed value received from the memory is non-zero and more than one location is present, divide the base portion into a plurality of smaller portions of locations;
designating each smaller portion of locations as new respective base portions;
sending read requests for the locations in each new base portion; and
iteratively repeat the steps of dividing base portions with non-zero summed values and more than one location into smaller respective base portions and sending read requests for locations in the new base portions, until there are no unread base portions in the memory with non-zero sums and more than one location.

10. The memory system of claim 9, wherein the controller identifies a sampling pattern for sampling the plurality of locations in the memory, wherein the sampling pattern is used to identify the plurality of locations for the read request.

11. The memory system of claim 10, wherein the controller repeats identifying the sampling pattern for sampling locations in the memory; sending the read request for the plurality of locations in a memory device to read the plurality of locations in parallel based on the upper bound for reading the memory; and receiving the summed value of the plurality of memory values in the plurality of locations in the memory using the sampling pattern to obtain summed values.

12. The memory system of claim 11, wherein the controller is configured to reconstruct memory values in the memory using the summed values via a simplex or interior-point method of linear programming.

13. The memory system of claim 11, wherein the controller creates the sampling pattern taking into account factors for reconstructing the memory values and the upper bound for the number of locations.

14. The memory system of claim 9 further comprising:
reconstructing the memory constructed from the locations with non-zero summed values.

15. The memory system of claim 9, wherein a constraint is based on at least one of an amount of power, a voltage, a current, or a physical limit on parallel reads for a memory device.

16. The memory system of claim 9, wherein the memory is selected from one of a cross point memory, a cross bar memory, a dynamic random access memory, an optical memory, and a quantum memory.

17. A method for accessing a memory for a data processing system, the method comprising:
selecting, by a controller, a plurality of memory locations according to a sampling pattern, wherein the sampling patterns occurs within an upper bound indicating a maximum number of locations that may be read in parallel from the memory;
designating, by the controller, the plurality of locations in the memory as a base portion of locations;

sending, by the controller, a read request to the memory to read the plurality of locations in parallel according to the sampling pattern;

receiving from the memory, by the controller, a summed value of respective binary values in the plurality of locations in the memory according to a summation function in the memory;

if the summed value received from the memory is zero, cease using those locations to read the memory;

if the summed value received from the memory is non-zero and more than one location is present, dividing, by the controller, the base portion into a plurality of smaller portions of locations;

designating, by the controller, each smaller portion of locations as new respective base portions;

sending, by the controller, read requests for the locations in each new base portion; and iteratively repeating, by the controller, the steps of dividing base portions with non-zero summed values and more than one location into smaller respective base portions and sending read requests for locations in the new base portions, until there are no unread base portions in the memory with non-zero sums and more than one location; and reconstructing, by the controller, memory values in the memory according to the summed values through a simplex or interior-point method of linear programming.

18. The method of claim 17, wherein the sampling pattern comprises a matrix, wherein the matrix comprises:
   a number of columns, wherein each column represents a memory location; and
   a number of rows containing ones and zeroes that identify memory locations for a read request, wherein a one in a row indicates an activation of a memory element, and wherein the number of ones in each row is upper bounded.

19. The method of claim 18, wherein the matrix satisfies Restricted Isometric Property condition RIP-1.

* * * * *